(12) United States Patent
Park

(10) Patent No.: US 6,852,168 B2
(45) Date of Patent: Feb. 8, 2005

(54) REACTOR FOR DEPOSITING THIN FILM ON WAFER

(75) Inventor: Young-Hoon Park, Pyungtaek-si (KR)

(73) Assignee: IPS Ltd. (KR)

( * ) Notice: Subject to any disclaimer, the term of this patent is extended or adjusted under 35 U.S.C. 154(b) by 1 day.

(21) Appl. No.: 09/848,577

(22) Filed: May 3, 2001

(65) Prior Publication Data

US 2002/0000196 A1 Jan. 3, 2002

(30) Foreign Application Priority Data

Jun. 24, 2000 (KR) .................................... 2000-35102

(51) Int. Cl.⁷ .......................... C23C 16/00; C23F 1/00; H01L 21/306

(52) U.S. Cl. .............. 118/715; 156/345.33; 156/345.34

(58) Field of Search ................ 118/715; 156/395.33, 156/395.34

(56) References Cited

U.S. PATENT DOCUMENTS

| | | | |
|---|---|---|---|
| 5,000,113 A | * 3/1991 | Wang et al. ............. | 118/723 E |
| 5,010,842 A | * 4/1991 | Oda et al. ............ | 118/723 ME |
| 5,076,207 A | 12/1991 | Washitani et al. | |
| 5,134,965 A | * 8/1992 | Tokuda et al. ...... | 118/723 MW |
| 5,332,442 A | * 7/1994 | Kubodera et al. .......... | 118/725 |
| 5,338,363 A | 8/1994 | Kawata et al. | |
| 5,387,557 A | 2/1995 | Takagi | |
| 5,425,812 A | * 6/1995 | Tsutahara et al. ........... | 118/725 |
| 5,439,524 A | 8/1995 | Cain et al. | |
| 5,525,160 A | * 6/1996 | Tanaka et al. .............. | 118/728 |
| 5,595,606 A | * 1/1997 | Fujikawa et al. ........... | 118/725 |
| 5,624,498 A | * 4/1997 | Lee et al. .................... | 118/725 |
| 5,779,849 A | 7/1998 | Blalock | |
| 5,851,294 A | * 12/1998 | Young et al. ............... | 118/715 |
| 5,976,261 A | * 11/1999 | Moslehi et al. ............. | 118/719 |
| 6,013,155 A | * 1/2000 | McMillin et al. ...... | 156/345.33 |
| 6,024,799 A | 2/2000 | Chen et al. | |
| 6,179,920 B1 | * 1/2001 | Tarutani et al. ............. | 118/715 |
| 6,217,658 B1 | * 4/2001 | Orczyk et al. .............. | 118/697 |
| 6,387,182 B1 | * 5/2002 | Horie et al. ................. | 118/244 |
| 6,436,193 B1 | * 8/2002 | Kasai et al. ................. | 118/715 |

FOREIGN PATENT DOCUMENTS

| | | | |
|---|---|---|---|
| EP | 0 540 082 | 5/1993 | |
| EP | 0 821 084 | 1/1998 | |
| EP | 0 836 227 | 4/1998 | |
| EP | 0 853 138 | 7/1998 | |
| EP | 0959150 | 11/1999 | |
| EP | 0 959 150 | 11/1999 | |
| JP | 31272938 A | * 2/1986 | ............ H01L/21/31 |
| JP | 02015171 A | * 1/1990 | ............ C23C/16/30 |
| JP | 04080366 A | * 3/1992 | ............ C23C/16/44 |
| JP | 09316644 | * 12/1997 | ......... C23C/16/044 |

* cited by examiner

Primary Examiner—Parviz Hassanzadeh
Assistant Examiner—Karla Moore
(74) Attorney, Agent, or Firm—Cantor Colburn LLP

(57) ABSTRACT

A thin film deposition reactor including a reactor block on which a wafer is placed, a shower head plate for uniformly maintaining a predetermined pressure by covering the reactor block, a wafer block installed in the reactor block, on which the wafer is to be seated; an exhausting portion connected to the reactor block for exhausting a gas from the reactor block; a first connection line in communication with the shower head plate, through which a first reaction gas and/or inert gas flow, a second connection line in communication with the shower head plate, through which a second reaction gas and/or inert gas flow, and a diffusion plate mounted on a lower surface of the shower head plate. The diffusion plate has a plurality of spray holes which are in communication with the first connection line and face the upper surface of the wafer to spray the first reaction gas and/or inert gas onto the wafer, and a plurality of nozzles which are in communication with the second connection line and extend toward the inner side surface of the reactor block to spray the second reaction gas and/or inert gas toward edges of the wafer.

19 Claims, 8 Drawing Sheets

REACTOR FOR DEPOSITING THIN FILM ON WAFER

BACKGROUND OF THE INVENTION

1. Field of the Invention

The present invention relates to a reactor for depositing a thin film on a semiconductor, for example, on a semiconductor wafer.

2. Description of the Related Art

A thin film deposition reactor forms a predetermined thin film on a wafer by introducing several types of reaction gases and mutually reacting them with each other.

This reactor has been continuously improved to make a highly-integrated chip and increase the efficiency of management and the productivity.

SUMMARY OF THE INVENTION

An objective of the present invention is to provide a reactor for depositing a semiconductor thin film, by which a thin film having excellent electrical characteristics, a high purity, in which impurities are removed from a wafer as much as possible, and an excellent step coverage can be formed.

To achieve the above objective, the present invention provides a thin film deposition reactor including a reactor block on which a wafer is placed, a shower head plate for uniformly maintaining a predetermined pressure by covering the reactor block, a wafer block installed in the reactor block, on which the wafer is to be seated, and an exhausting portion connected to the reactor block for exhausting a gas from the reactor block. The thin film deposition reactor further includes: a first connection line in communication with the shower head plate, through which a first reaction gas and/or inert gas flow; a second connection line in communication with the shower head plate, through which a second reaction gas and/or inert gas flow; and a diffusion plate mounted on a lower surface of the shower head plate. This diffusion plate has a plurality of spray holes which are in communication with the first connection line and face the upper surface of the wafer to spray the first reaction gas and/or inert gas onto the wafer, and a plurality of nozzles which are in communication with the second connection line and extend toward the inner side surface of the reactor block to spray the second reaction gas and/or inert gas toward edges of the wafer.

BRIEF DESCRIPTION OF THE DRAWINGS

The above objective and advantages of the present invention will become more apparent by describing in detail preferred embodiments thereof with reference to the attached drawings in which.

DESCRIPTION OF THE PREFERRED EMBODIMENTS

Figure 1:
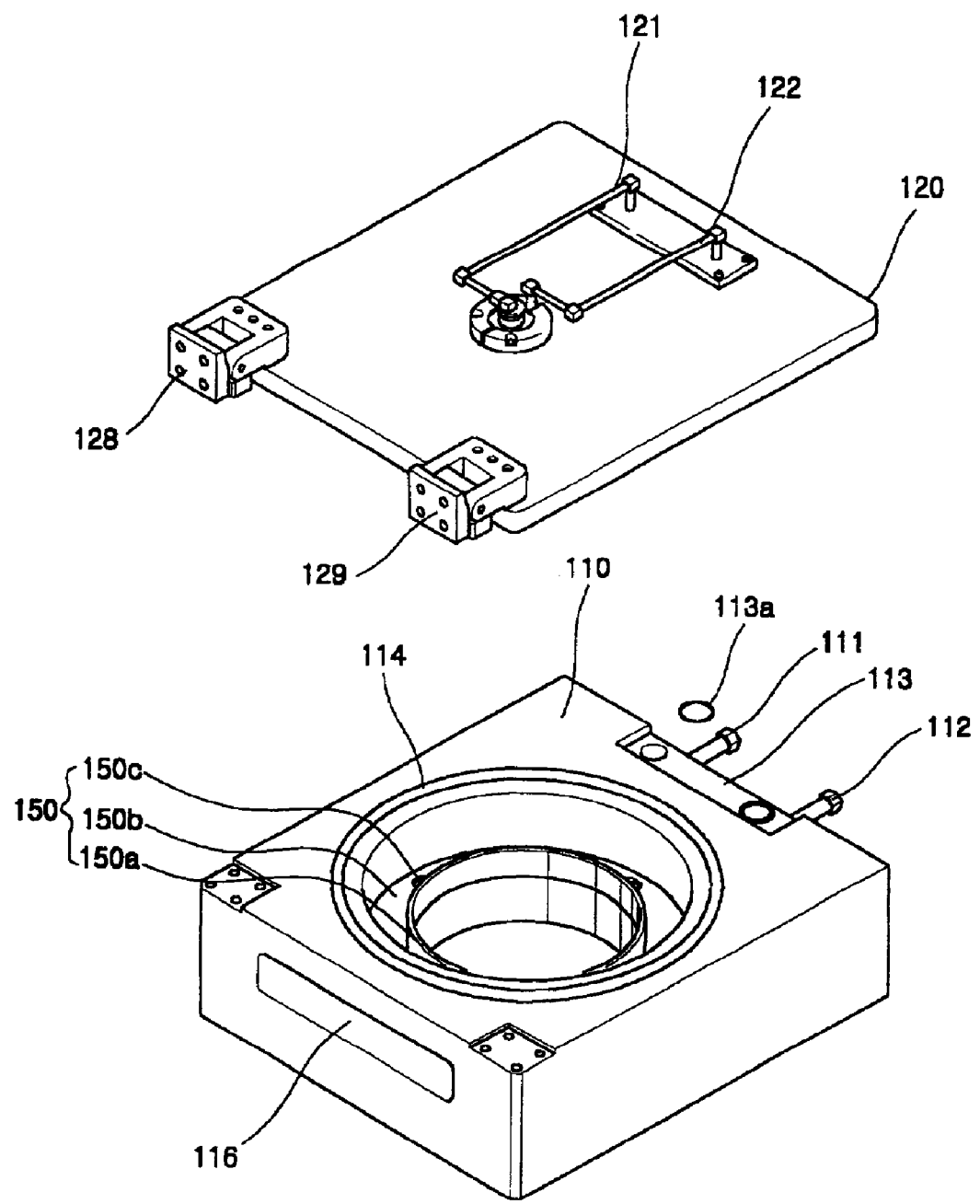
FIG. 1 is an exploded perspective view of a thin film deposition reactor according to the present invention.
Figure 2:
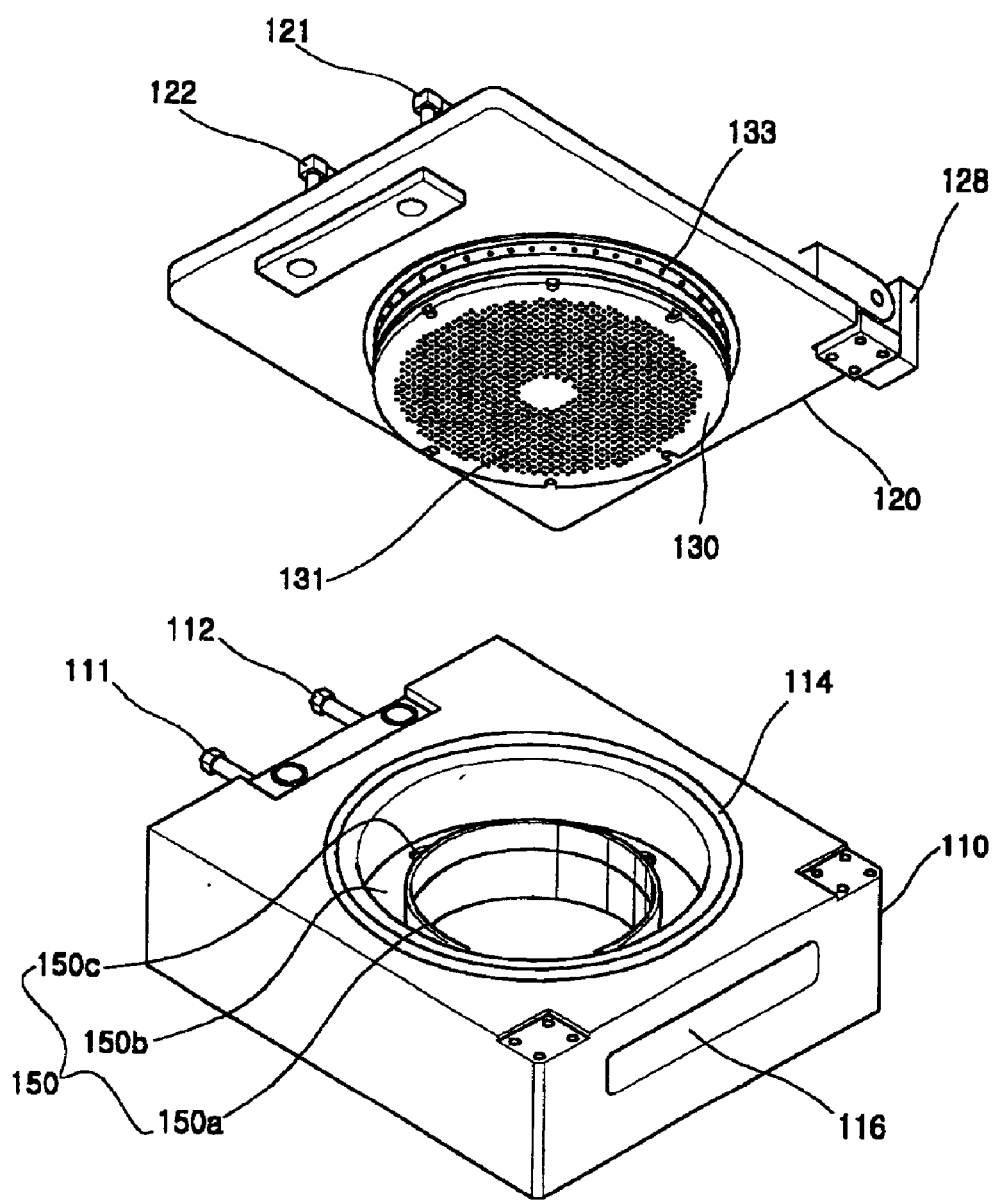
FIG. 2 is an exploded perspective view of a shower head plate and a diffusion plate in the reactor of FIG. 1.

Referring to FIGS. 1 and 2, a thin film deposition reactor according to the present invention includes a reactor block 110 on which a wafer is placed, a shower head plate 120 coupled to the reactor block 110 using hinges 128 and 129, a diffusion plate 130 installed on the shower head plate 120 for spraying a reaction gas and/or inert gas, and a wafer block (not shown) installed within the reactor block 110, on which a wafer is seated.

First and second connection lines 121 and 122 are installed on the shower head plate 120, and are connected to first and second connection pipes 111 and 112 to be described later. The first connection line 121 flows a first reaction gas and/or inert gas supplied via the first connection pipe 111 to a reactor, and the second connection line 122 flows a second reaction gas and/or inert gas supplied via the second connection pipe 112 to the reactor.

The first and second connection pipes 111 and 112 are installed on the reactor block 110. The first and second connection pipes 111 and 112 are connected to the first and second connection lines 121 and 122, respectively, installed on the shower head plate 120 via a connecting portion 113. An O-ring 113a is installed on the connecting portion 113, and connects the first and second connection pipes 111 and 112 to the first and second connection lines 121 and 122 so that they are sealed, when the shower head plate 120 covers the reaction block 110. When the shower head plate 120 is opened from the reaction block 110, the first and second connection pipes 111 and 112 are separated from the first and second connection lines 121 and 122.

Figure 7:
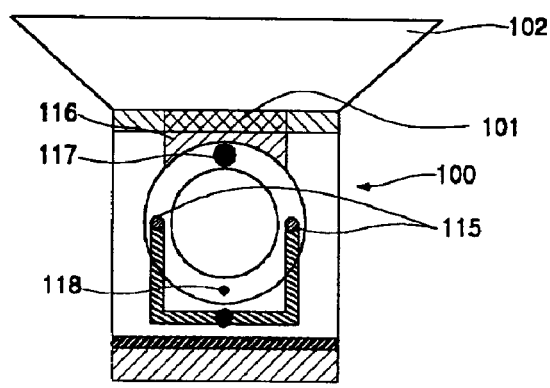
FIG. 7 shows a reactor combined with a transfer module through a vat valve.

At least two exhaust holes 117 and 118 for exhausting introduced inert gases and/or reaction gases are formed on the bottom of the reactor block 110 as shown in FIG. 7. A main O-ring 114 is installed on the upper surface of the reactor block 110, so that the reactor block 110 and the shower head plate 120 are securely sealed when the shower head plate 120 is covered.

The shower head plate 120 covers the reactor block 110, so that a predetermined pressure is maintained constant within the reactor block 110. Also, the shower head plate 120 covers the reactor block 110 so that the diffusion plate 130 is placed within the reactor block 110.

Figure 3:
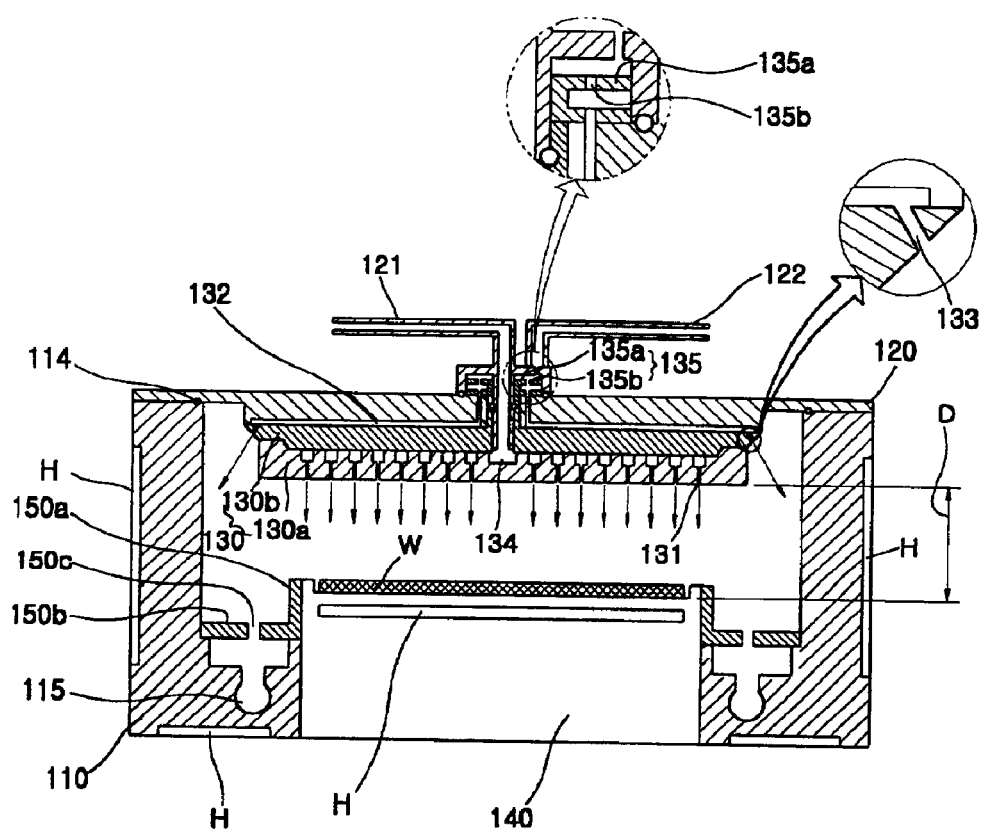
FIG. 3 is a cross-sectional view of a first embodiment of the reactor of FIG. 1.
Figure 4:
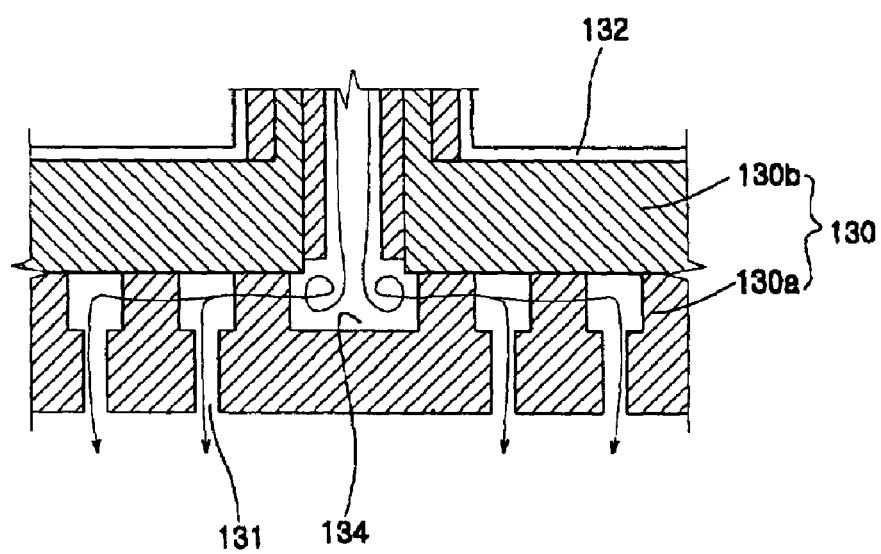
FIG. 4 is a magnified cross-sectional view of the first mixing unit of FIG. 3.
Figure 5:
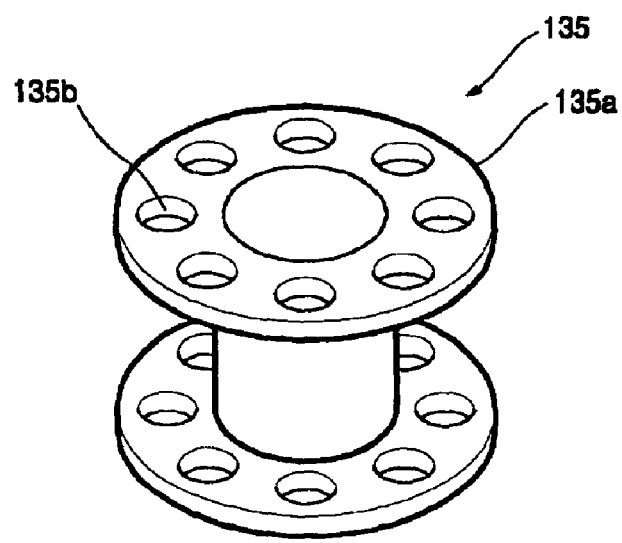
FIG. 5 is a perspective view of the second mixing unit of FIG. 3.
Figure 6:
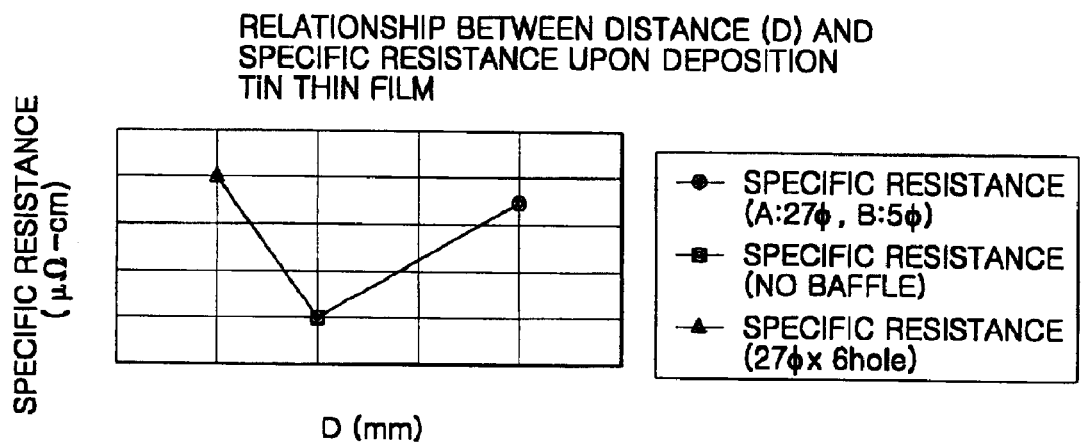
FIG. 6 is a graph showing the relationship between an interval (D) and a specific resistance while a thin TiN film is deposited.

FIG. 3 is a cross-sectional view of a first embodiment of the reactor of FIG. 1, FIG. 4 is a magnified cross-sectional view of the first mixing unit of FIG. 3, FIG. 5 is a perspective view of the second mixing unit of FIG. 3, and FIG. 6 is a graph showing the relationship between an interval (D) and a specific resistance while a thin TiN film is deposited.

Referring to FIGS. 3, 4, 5 and 6, the diffusion plate 130, which sprays a gas during a thin film deposition process, is installed on the bottom of the shower head plate 120. A plurality of spray holes 131, which are connected to the first connection line 121 and faces the upper surface of a wafer w to spray a first reaction gas and/or inert gas onto the wafer w, are formed on the diffusion plate 130. Also, a plurality of nozzles 133, which are connected to a passage 132 leading to the second connection line 122 and face the inner side surface of the reactor block 110 to spray a second reaction gas and/or inert gas onto the edges of the wafer w, are formed on the diffusion plate 130.

The diffusion plate 130 can be made up of a first diffusion plate 130a having the plurality of spray holes 131 connected to the first connection line 121, and a second diffusion plate 130b having the plurality of nozzles 133 connected to the second connection line 122. Here, the cross-section of the first diffusion plate 130a between spray holes 131 has the shape of upside-down T, so that thermal energy from the wafer block 140 is evenly conducted to the shower head plate 120 via the second diffusion plate 130b. Consequently, the diffusion plate 130 is prevented from being overheated. The height of the upside-down T-shaped cross-section of the first diffusion plate 130a must be 5 mm or greater to prevent the first diffusion plate 130a from being easily bent during deposition. In the present embodiment, the diffusion plate 130 is made up of the first and second diffusion plates 130a and 130b. However, even if the diffusion plate 130 is formed in one body, the same effects can be generated.

A first mixing portion 134 for evenly mixing a first reaction gas and an inert gas and flowing the mixture to the spray hole 131 is formed at the center of the inside of the first diffusion plate 130a, as shown in FIGS. 3 and 4. The first reaction gas and the inert gas flowing via the connection line 121 are swirled and mixed, and then diffused and evenly sprayed onto the wafer via all of the spray holes 131.

Spray holes 131 are not formed below the first mixing portion 134 in the first diffusion plate 130a, as shown in FIGS. 2 and 4. Preferably, the entire area of the first diffusion plate 130a having the spray holes 131 is larger than the area of the wafer w, so that a gas can be evenly spayed over the entire surface of the wafer.

Preferably, the diameter of the spray holes 131 is between 1 mm and 2.5 mm. This diameter, which is obtained by several experiments, allows an excellent thin film to be formed on the wafer w. Also, the number of spray holes 131 is about 100 to 1000 according to their diameter. In this embodiment, more than 160 spray holes are-formed.

The nozzles 133 lead to the passages 132 radially formed from a second mixing portion 135, and are slanted toward the inner side surface of the reactor block 110, as shown in FIG. 3. Preferably, there are 30–100 nozzles 133. In the present embodiment, 48 nozzles are formed.

The second mixing portion 135 for evenly mixing a second reaction gas and an inert gas is formed between the second connection line 122 and the shower head plate 120, as shown in FIGS. 3 and 5. The second mixing portion 135 has an auxiliary diffusion plate 135a in which holes 135b are formed. The auxiliary diffusion plate 135a can be formed in various structures to mix gases, other than the structure shown in FIG. 5.

The wafer block 140 installed within the reactor block 110 safely seats a wafer w thereon. A heater H is installed in the wafer block 140 to heat and maintain the wafer block 140 to a predetermined temperature during deposition.

The interval (D) between the diffusion plate 130 and the wafer block 140 is in the range of 20 mm to 50 mm. Referring to FIG. 6, which is a graph showing the interval (D) and specific resistance during deposition of a thin film, it can be seen that the specific resistance is the lowest when the interval (D) between the diffusion plate 130 and the wafer block 140 is 30 mm. However, when other conditions, for example, the types and amounts of first and second reaction gases, the temperature of a wafer block, or the like, were changed, specific resistance values were low at the intervals D within a range of about 20 to 50 mm, and it can be concluded that the interval D is an important structural property in forming an excellent thin film.

The interval within this range is compared to a conventional chemical vapor deposition (CVD) reactor in which the interval between a diffraction plate to which a reaction gas is sprayed and a wafer block on which a wafer is seated is about 50 to 100 mm. In the present invention, since the interval D is smaller than that in the prior art, a dense first reaction gas layer is formed on a wafer w by the pressure of a first reaction gas and/or inert gas sprayed from the spray holes 131. The first reaction gas layer reacts with a second reaction gas flowed in later, so that a thin film having a higher purity and an excellent electrical property can be formed.

A pumping baffle 150 is installed around the wafer block 140. The pumping baffle 150 is made up of a sidewall 150a installed on the lateral side of the wafer block 140, and a bottom wall 150b through which symmetrical holes 150c are formed. A donut-shaped pumping pot 115 connected to an exhaust line is formed below the bottom wall 150b of the pumping baffle 150, that is, on the bottom of the reactor block 110.

The sidewall 150a and the bottom wall 150b of the pumping baffle 150 provide a space in which a second reaction gas and/or inert gas sprayed onto the inner side surface of the reactor block 110 can more evenly react to the first reaction gas layer formed on the wafer w. A process product generated during deposition of a thin film, and gases not used during deposition of a thin film are slipped through the hole 150c. These gases pass through the exhaust holes 117 and 118, and are exhausted via the pumping pot 115.

When a thin film is deposited, the pressure within a reactor must be maintained to be 1 to 10 torr. In order to observe and control this pressure, a pressure measuring portion (not shown) is installed within the reactor.

This thin film deposition reactor has heaters (H) formed inside and outside to heat the reactor when a thin film is deposited. For example, when a TiN thin film is deposited, the temperature of the inner surface of the reactor block 110 must be kept at about 120 to 200° C., and the temperature of the diffusion plate 130 must be kept at about 150 to 260° C. Also, the wafer block 140 must be kept at a temperature of about 425 to 650° C., and the pumping baffle 150 must be kept at a temperature of about 150 to 230° C.

The thin film deposition reactor having such a configuration is combined with a transfer module 102 for supplying and transferring a wafer w, having a vat valve 101 between the reactor and the transfer module 102, as shown in FIG. 7. The wafer w is transferred into the reactor 100 via a wafer transfer hole 116 using a robot arm (not shown) of the transfer module 102, and then safely seated on the wafer block 140. Here, the temperature of the vat valve 101 must be maintained at 140 to 170° C.

In a state where the wafer w transferred via the wafer transfer hole 116 is seated on the wafer block 140 and heated to a predetermined temperature, a first reaction gas and/or inert gas is sprayed onto the wafer w through the spray holes 131 of the first diffusion plate 130a along a route from the first connection pipe 111 to the first connection line 121, and a second reaction gas and/or inert gas is sprayed onto the edges of the wafer w, that is, toward the inner side surface of the reactor block 110, through the nozzles 133 of the second diffusion plate 130b along a route from the second connection pipe 112, to the second connection line 122, and to the passage 132. The first and second reaction gases are used to form a thin film on the wafer w, and process products or gases not used for depositing a thin film are exhausted to the outside through the exhaust holes 117 and 118 and the pumping pot 115.

Figure 8:
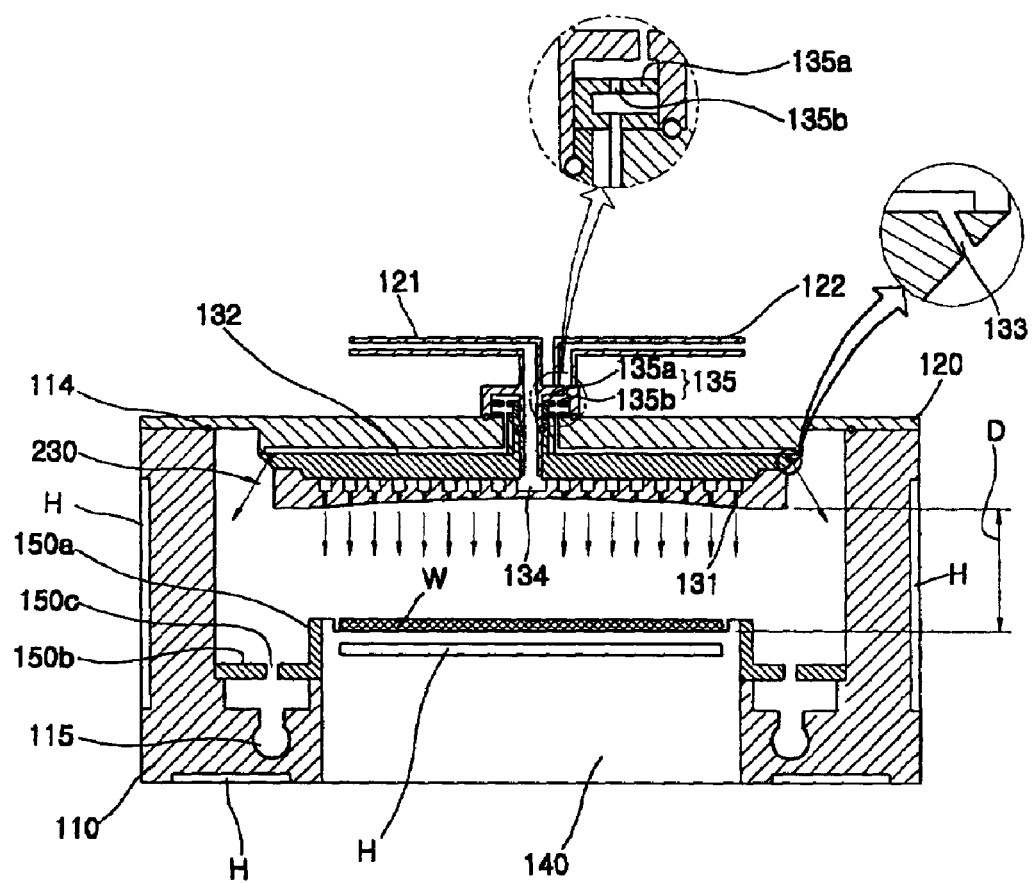
FIG. 8 is a cross-sectional view of a second embodiment of the reactor of FIG. 1.
Figure 9:
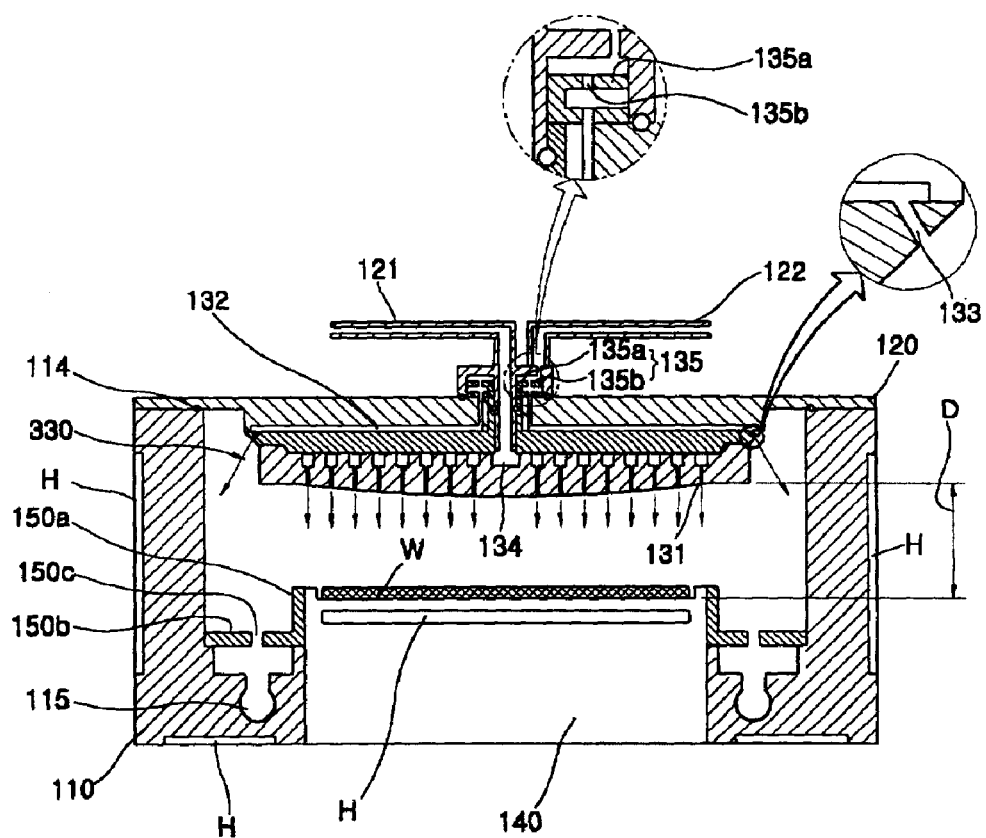
FIG. 9 is a cross-sectional view of a third embodiment of the reactor of FIG. 1.

FIG. 8 is a cross-sectional view of a second embodiment of the reactor of FIG. 1, and FIG. 9 is a cross-sectional view of a third embodiment of the reactor of FIG. 1. Here, the same reference numerals as those in FIG. 3 denote the same elements having the same functions. Referring to FIGS. 8 and 9, a diffusion plate 230 has a concave bottom, and a diffusion plate 330 has a convex bottom.

A die produced by a wafer w on which a thin film is deposited must have constant electrical characteristics. To achieve this, the thickness, purity and the electrical property of a film deposited on the entire surface of a wafer must not be variable.

However, when a thin film is deposited on a wafer w using the reactor according to the first embodiment, a second reaction gas is eddied around the inner surface of the reactor block 110 and then flows from the edges of the wafer to the upper surface thereof. This may cause a difference in the thickness, purity, and electrical property between a thin film deposited on the edges of the wafer and a thin film deposited at the center thereof. Thus, the difference in the thickness, purity, and electrical property between a thin film on the edges of the wafer and a thin film at the center thereof must be narrowed by changing the process conditions such as the amount of gas, the process pressure, and others. However, the change in these process conditions may not narrow the difference.

In this case, the interval between the wafer block 140 and the center of the diffusion plate is made different from that between the wafer block 140 and the edges of the diffusion plate, by applying the diffusion plate 230 having a concave bottom as shown in FIG. 8, or applying the diffusion plate 330 having a convex bottom as shown in FIG. 9.

Figure 10:
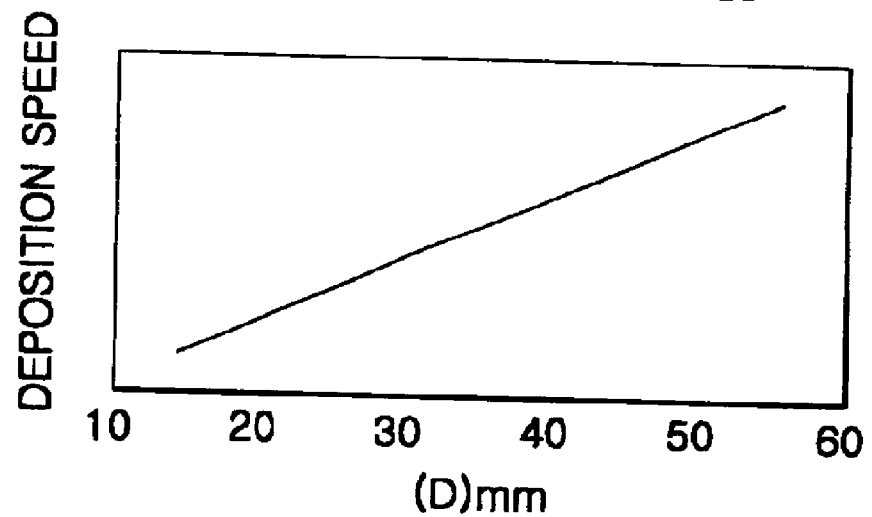
FIG. 10 is a graph showing the relationship between an interval (D) and a deposition speed while a thin film is deposited.

This is made in consideration of the fact that the interval (D) between a diffusion plate and a wafer block 140 is an important factor in depositing a thin film. That is, as shown in FIG. 10, a particular functional relationship is established between the interval (D) and a deposition speed, so that the thickness, purity or electrical characteristics of a deposited thin film can be changed by varying the interval (D). That is, the thickness, purity and electrical characteristics of a deposited thin film can be adjusted to desired values by making the interval at the edges smaller than the interval at the center as shown FIG. 8, or by making the interval at the edges greater than the interval at the center as shown FIG. 9.

In a semiconductor thin film deposition reactor according to the present invention, a mixture of a first reaction gas and an inert gas is sprayed onto a wafer through spray holes, so that a first reaction gas layer is formed. Also, a second reaction gas and an inert gas are sprayed toward the inner side surface of a reactor block and then flows to the upper surface of the wafer while reacting to the first reaction gas layer. In particular, the first reaction gas layer and a second reaction gas layer are continuously and sequentially formed. Therefore, a thin film having a high purity in which impurities are removed as much as possible, and excellent electrical characteristics, can be obtained on a wafer with an excellent step coverage.

What is claimed is:

1. A thin film deposition reactor comprising:
a reactor block on which a wafer is placed;
a shower head plate for uniformly maintaining a predetermined pressure by covering the reactor block;
a wafer block installed in the reactor block, on which the wafer is to be seated;
an exhausting portion connected to the reactor block for exhausting a gas from the reactor block;
a first connection line in communication with the shower head plate for supplying a first reaction gas and an inert gas;
a second connection line in communication with the shower head plate for supplying a second reaction gas and the inert gas;
a diffusion plate mounted on a lower surface of the shower head plate, the diffusion plate having a plurality of spray holes which is in communication with the first connection line and face the upper surface of the wafer to spray the first reaction gas and the inert gas onto the wafer, and a plurality of nozzles which is in communication with a passage radially formed from the second connection line and extend toward the inner side surface of the reactor block to spray the second reaction gas and the inert gas toward edges of the wafer, whereby the first and second reaction gases are applied on the wafer without mixing each other; and
a second mixing portion between the second connection line and the shower head plate for mixing the second reaction gas and the inert gas supplied from the second connection line and diffusing the mixture to the nozzles through the passage, the second mixing portion having an auxiliary diffusion plate in which holes are formed.

2. The thin film deposition reactor of claim 1, wherein the diffusion plate has a lower surface of a concave form.

3. The thin film deposition reactor of claim 1, wherein the diffusion plate has a lower surface of a convex form.

4. The thin film deposition reactor of claim 1, wherein the diffusion plate further comprises a first diffusion plate in communication with the plurality of spray holes and the first connection line, and a second diffusion plate in communication with the plurality of nozzles and the second connection line.

5. The thin film deposition reactor of claim 1, further comprising a first mixing portion between the first connection line and the spray holes for mixing the first reaction gas and the inert gas supplied from the first connection line and diffusing the mixture to the spray holes.

6. The thin film deposition reactor of claim 1, wherein an area of the diffusion plate on which the spray holes are formed is larger than the wafer.

7. The thin film deposition reactor of claim 1, wherein the diameter of each of the spray holes is 1 to 2.5 mm.

8. A thin film deposition reactor of claim 7, wherein the number of spray holes is 100 to 1000.

9. The thin film deposition reactor of claim 8, wherein the spray hole comprises an upper end and a lower end, and the upper end has a diameter larger than that of the lower end so that thermal energy from the wafer block is evenly transferred to the shower head plate to prevent the diffusion plate from being overheated.

10. The thin film deposition of claim 9, wherein the diffusion plate has a thickness of at least 5 mm to prevent the diffusion plate from being bent at a high temperature.

11. The thin film deposition reactor of claim 1, wherein the number of nozzles is 30 to 100.

12. The thin film deposition reactor of claim 1, wherein a distance between the diffusion plate and the wafer block is 20 to 50 mm.

13. The thin film deposition reactor of claim 1, further comprising a pumping baffle which is installed on the outer circumference of the wafer block, the pumping baffle comprising a sidewall placed around the lateral side of the wafer block, a bottom wall extended outward from a lower end of the sidewall, and holes formed in the bottom wall.

14. The thin film deposition reactor of claim 9, wherein the spray hole further comprises a step between the upper end and the lower end.

15. The thin film deposition reactor of claim 4, wherein the first diffusion plate has a thickness of at least 5 mm.

16. The thin film deposition reactor of claim 13, wherein the holes are symmetrically arranged.

17. The thin film deposition reactor of claim 2, wherein an interval between a center of the diffusion plate and the wafer block is different from an interval between edges of the diffusion plate and the wafer block.

18. The thin film deposition reactor of claim 17, wherein the interval between the center of the diffusion plate and the wafer block is larger than the interval between the edges of the diffusion plate and the wafer block to adjust a thickness, purity and electrical characteristics of a deposited thin film.

19. The thin film deposition reactor of claim 17, wherein the interval between the center of the diffusion plate and the wafer block is smaller than the interval between the edges of the diffusion plate and the wafer block to adjust thickness, purity and electrical characteristics of a deposited thin film.

* * * * *